(12) United States Patent
Mäki et al.

(10) Patent No.: US 9,743,536 B2
(45) Date of Patent: Aug. 22, 2017

(54) MOBILE DEVICE ASSEMBLY

(71) Applicant: MICROSOFT TECHNOLOGY LICENSING, LLC, Redmond, WA (US)

(72) Inventors: Jouni Mäki, Suomi (FI); Teemu Harju, Suomi (FI); Antero Aaltonen, Suomi (FI)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 96 days.

(21) Appl. No.: 14/551,412

(22) Filed: Nov. 24, 2014

(65) Prior Publication Data

US 2016/0150656 A1 May 26, 2016

(51) Int. Cl.
*H05K 5/00* (2006.01)
*H04M 1/02* (2006.01)
*G06F 1/16* (2006.01)

(52) U.S. Cl.
CPC ......... *H05K 5/0017* (2013.01); *G06F 1/1637* (2013.01); *H04M 1/0266* (2013.01); *H05K 5/0086* (2013.01)

(58) Field of Classification Search
CPC .. H05K 5/0086; H05K 5/0017; H04M 1/0266
See application file for complete search history.

(56) References Cited

U.S. PATENT DOCUMENTS

| 6,064,453 A * | 5/2000 | Inubushi ........... G02F 1/133308 349/58 |
| 6,256,015 B1 * | 7/2001 | Adler .................. G06F 3/039 345/163 |
| 8,159,629 B2 | 4/2012 | Yamashita et al. |
| 8,421,743 B2 | 4/2013 | Jung |
| 8,749,492 B2 * | 6/2014 | Kotera ................. G06F 3/0412 345/173 |
| 2005/0137549 A1 * | 6/2005 | Lindsay ........... A61F 13/15593 604/385.01 |
| 2007/0065091 A1 * | 3/2007 | Hinata ............. G02F 1/133308 385/147 |

(Continued)

FOREIGN PATENT DOCUMENTS

| CN | 202678556 U | 1/2013 |
| CN | 103530013 A | 1/2014 |
| WO | 2014024010 A1 | 2/2014 |

OTHER PUBLICATIONS

Severinkangas, Kari, "FTIR touch panel for a mobile device", In Thesis for Degree of Master Degree Program in Information, Retrieved on: Aug. 21, 2014, 46 pages.

*Primary Examiner* — Hoa C Nguyen
*Assistant Examiner* — Keith Depew

(57) ABSTRACT

A mobile device assembly comprises a display module having a display assembly, the display assembly having a front surface, a back surface, and a peripheral edge surface; a chassis supporting the display module from the back surface of the display assembly; and a circumferential frame having a front frame portion defining a front opening smaller than a display module width. The display module is pressed between the front frame portion and the chassis. The chassis is attached, by means of an adhesive, to the circumferential frame.

20 Claims, 5 Drawing Sheets

(56) References Cited

U.S. PATENT DOCUMENTS

| | | | | |
|---|---|---|---|---|
| 2009/0049773 A1* | 2/2009 | Zadesky | ........... | B32B 17/10018 52/204.62 |
| 2009/0251775 A1* | 10/2009 | Jung | ................ | G02F 1/133308 359/485.01 |
| 2011/0186345 A1* | 8/2011 | Pakula | .................. | G06F 1/1626 174/520 |
| 2011/0255036 A1* | 10/2011 | Aaltonen | .......... | G02F 1/133308 349/96 |
| 2012/0281380 A1* | 11/2012 | Werner | ................ | G06F 1/1626 361/807 |
| 2013/0016486 A1 | 1/2013 | Allore et al. | | |
| 2013/0169575 A1 | 7/2013 | Masuda et al. | | |
| 2014/0053392 A1* | 2/2014 | Rothkopf | .............. | G06F 1/1637 29/593 |
| 2014/0063705 A1* | 3/2014 | Song | ................... | H04M 1/0266 361/679.01 |
| 2014/0168090 A1* | 6/2014 | Aaltonen | ............. | G06F 1/1601 345/173 |
| 2014/0241564 A1* | 8/2014 | Kang | .................... | H04R 7/045 381/386 |
| 2015/0068674 A1* | 3/2015 | Tsuchida | ............... | G02F 1/1333 156/275.5 |
| 2016/0109906 A1* | 4/2016 | Trutna | ............. | G02F 1/133308 361/747 |

* cited by examiner

MOBILE DEVICE ASSEMBLY

BACKGROUND

Various mobile devices incorporate displays for displaying information. Such display may also be an interactive, touch sensitive display providing also a user interface of the mobile device. It may be desirable that an operable area of the display covers as big portion of the mobile device surface as possible.

Optimizing said portion of the device surface, which the operable area of the display covers, may require that the mechanical structure of the mobile device assembly incorporating a display should only limitedly extend the device lateral dimensions outside the display. On the other hand, also the overall thickness of the device may be desired to keep limited. At the same time, the mechanical structure should provide sufficiently rigid support for the display to keep it in correct place, and to prevent it from moving relative to the other parts of the mobile device.

Further utility improvement may advantageously be provided by a mobile device assembly facilitating separation of the display module from the rest of the mobile device assembly.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A mobile device assembly may comprise: a display module having a display assembly, the display assembly having a front surface, a back surface, and a peripheral edge surface; a chassis supporting the display module from the back surface of the display assembly; and a circumferential frame having a front frame portion defining a front opening smaller than a display module width. The display assembly may be pressed between the front frame portion and the chassis, the chassis being attached, by means of an adhesive, to the circumferential frame.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Although some of the present examples may be described and illustrated herein as being implemented in or for a smartphone or a mobile phone, these are only examples of a mobile device and not a limitation. As those skilled in the art will appreciate, the present examples are suitable for application in a variety of different types of mobile devices, especially electronic mobile devices, for example, in tablet computers, game consoles or game controllers, etc.

Figure 1:
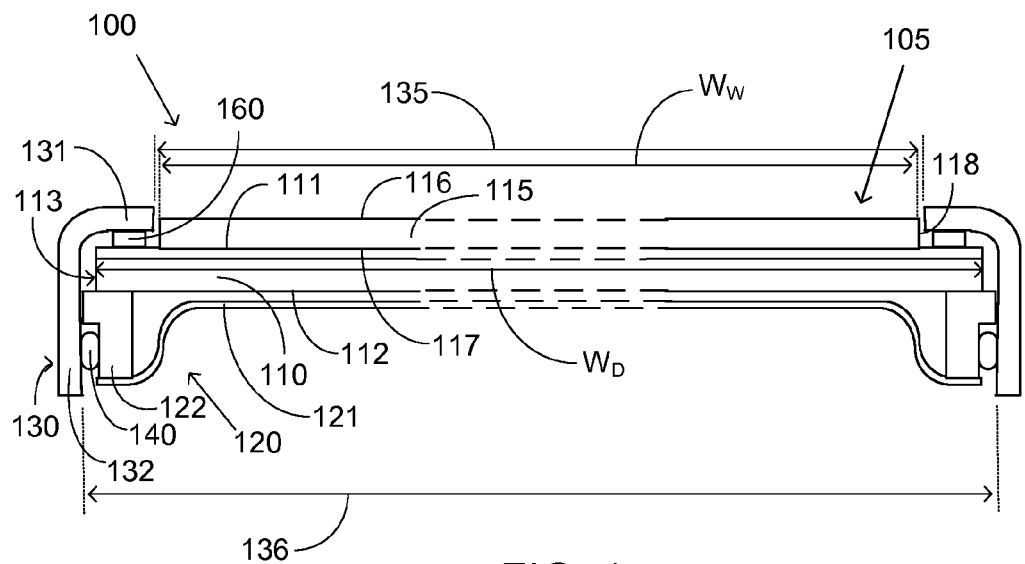
FIG. 1 shows a detail view of a mobile device assembly.

FIG. 1 shows, as a schematic drawing, a partial cross-section of a mobile device assembly 100 incorporating a display module 105. The mobile device assembly may be e.g. an assembly for a smartphone, mobile phone, tablet computer, or a game controller, or any other mobile device incorporating a display.

By "mobile device assembly" is meant in this specification generally an assembly which may form or may be intended to form a part of a complete mobile device, or a complete mobile device.

The display module 105 comprises a display assembly 110.

By "display assembly" is meant in this specification generally an assembly comprising an electronic display element capable of displaying information to the outside of the mobile device assembly or mobile device into which it is incorporated. The display element may be based on any appropriate display technology, including, for example, LCD (Liquid Crystal Display), OLED (Organic Light-Emitting Diode), and AMOLED (Active-Matrix Organic Light-Emitting Diode), and any of their variants. The display assembly may comprise a passive display element for presenting information one-directionally only, without any interactivity. The display assembly may also comprise e.g. an interactive display, operable e.g. by touching it. Such touch display or touch screen, capable of providing a touch based user interface, may be based on any appropriate touch sensing technology, such as capacitive and resistive technologies and their variants.

A display assembly, such as that of FIG. 1, may comprise several structural and/or operational layers and partial elements. For example, it may comprise, in the case of a touch screen, a touch sensitive layer and one or more display layers superposed on each other. The structure and shape of the display assembly is generally plate-like with its lateral dimensions substantially larger than its thickness.

The display assembly 110 has a front surface 111, a back surface 112, and a peripheral edge surface 113 forming a side surface of the display assembly, joining together the front surface and the back surface.

In this specification, "front" refers to the direction and side facing towards the direction to which side the display assembly displays, when in use, information. Thus, the front side of a mobile device assembly or a mobile device means the side from which the user of a mobile device can see the information displayed by the display assembly. Correspondingly, "back" refers to the opposite direction and side facing towards the back side of the mobile device assembly or a mobile device incorporating such mobile device assembly.

The mobile device assembly 100 comprises also a chassis 120. The chassis supports the display module from the back surface 112 of the display assembly. Said support provided by the chassis means that the display assembly lies on the chassis, possibly separated therefrom by some intermediate layer(s) or element(s), with the back surface thereof facing towards the chassis. Thereby, the chassis prevents the display assembly from moving towards the back side of the mobile device assembly. The chassis may also serve as a mounting substrate for various mobile device components and elements.

In the example of FIG. 1, the chassis comprises two parts, a chassis plate 121 and a chassis support part 122 attached to the chassis plate. In the example of FIG. 1, the chassis support part lies on the edge area of the chassis plate, the chassis plate being curved so that said edge area lies at a different level than the chassis plate central area. The chassis support part thickness is adjusted so that the chassis support part extends higher, i.e. farther towards the front side of the mobile device assembly, than the chassis plate. The chassis support part is in contact with the display assembly back surface 112, whereas there is a gap between the chassis plate central area and the display assembly. There may be, for example, some mobile device components or elements, such as flexible cables or circuit boards (not shown in the drawing), located in said gap.

The mobile device assembly is surrounded by a circumferential frame 130, i.e. a frame forming a closed circumference. The circumferential frame may be designed to form a part of an outer casing of a complete mobile device, a part of which the mobile device assembly forms or is intended to form.

The circumferential frame comprises a front frame portion 131 extending laterally, i.e. in the lateral direction of the display assembly, partially over the display module. The front frame portion may extend as a continuous structure over the entire circumference of the circumferential frame, thereby forming a closed circumferential structure. In some application it may also be possible that the front frame portion just comprises discrete front frame sections at opposite sides of the circumferential frame. In both cases, when observing a cross section of the mobile device assembly 100 at a location where the front frame portion exists at opposite sides of the mobile device assembly, the front frame portion defines a front opening 135 which is smaller than the width WD of the display module 105 at the plane of that cross section. In the case of a continuous front frame portion 131 forming a closed circumferential structure, the front frame portion may advantageously define such front opening, smaller than the width of the display assembly, in any cross sectional plane of the mobile device assembly.

In the example of FIG. 1, the circumferential frame also comprises a side frame portion 132. The side frame portion encloses the peripheral edge surface 113 of the display assembly. The front frame portion 131 and the side frame portion 132 form one single integral circumferential frame structure. When observed in the cross-sectional plane illustrated in FIG. 1, the side frame portion extends mainly in the thickness direction of the mobile device assembly. The front frame portion 131 is connected to the upper end, i.e. to the end at the front side of the mobile device assembly, of the side frame portion 132, and extends mainly laterally therefrom towards the central area of the mobile device assembly.

As an alternative to the example of FIG. 1, the side frame portion could enclose the peripheral edge surface of the display assembly only partially. This could be implemented e.g. by means of a side frame portion having a height lower than the thickness of the display assembly so that the lowermost portion of the display assembly would not be enclosed by the side frame portion.

The side frame portion 132 of the circumferential frame defines a back opening 136 which is larger than the display module width WD.

The chassis 120 and the circumferential frame 130 are attached together so located relative to each other that the display module 105 is pressed between the chassis and the front frame portion 131 of the circumferential frame. In other words, the chassis and the front frame portion are so close to each other in the thickness direction of the mobile device assembly that they cause oppositely directed compressive forces to be applied to the display module. In the example of FIG. 1, this is implemented by that the front frame portion 131 of the circumferential frame presses the front surface 111 of the display assembly, on the edge area thereof, towards the back side of the mobile device assembly, and the chassis support part presses the back surface 112 of the display assembly, on the edge area thereof, to the opposite direction, i.e. towards the front side of the mobile device assembly.

Such pressing does not necessitate that the front frame portion 131 and the chassis 120 are in direct contact with the display module. An example of indirect contact is seen in the example of FIG. 1, where a front gasket 160, made of a resilient material, is located between the display assembly 110 and the front frame portion 131. The front gasket forms a sealing between the front frame portion and the display assembly. As a resilient structure, it may also serve as a spring-like element conveying, or forwarding, the pressing force from the front frame portion 131 to the display assembly. Similarly, there could be a gasket or cushion also between the back surface of the display assembly and the chassis.

Figure 3:
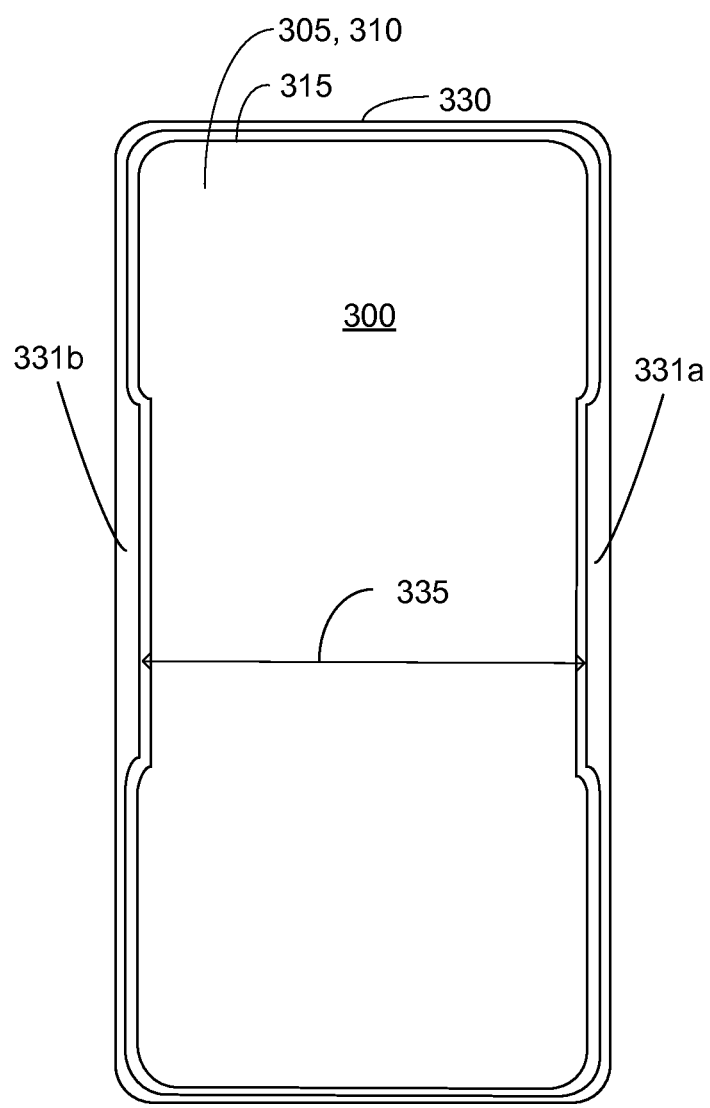
FIG. 3 shows a front view of a mobile device assembly.

The mutual location of the chassis and the circumferential frame in the thickness direction of the mobile device assembly, said mutual location providing said pressing effect, is fixed by having the chassis and the circumferential frame attached to each other by means of an adhesive block 140. In the example of FIG. 3, this is implemented by attaching the chassis, from the support part 122 thereof, to the side frame portion 132 of the circumferential frame. There may be adhesive between the chassis and the circumferential frame at each location along the periphery of the chassis, thereby forming a continuous, circumferential adhesive joint between those two elements of the mobile device assembly. Alternatively, adhesive blocks may be present at a plurality of discrete locations along the periphery of the chassis only.

The display module 105 of the mobile device assembly of FIG. 1 comprises also a window plate 115 having a window plate front surface 116, a window plate back surface 117, and a window plate edge 118. The window plate may be made e.g. of a glass. The window plate may serve for protective purposes, i.e. protecting the display assembly. It may also affect the optical performance of the display module. In the case of a display assembly implemented as a touch screen, the window plate front surface may form the actual touch surface which the user of a mobile device, in which the mobile device assembly is incorporated, touches.

The window plate is mounted, e.g. by means of an adhesive or by bonding, on the front surface 111 of the display assembly, with the window plate back surface 117 facing towards the display assembly. The window plate has a window width $W_W$ which is smaller than the front opening 135 defined by the front frame portion 131 so that the window plate fits in the front opening. Said width being smaller than the front opening 135, which in turn is smaller than the width WD of the display module, results in that the display assembly 110 extends beyond the window plate edge 118 and defines the window assembly width.

The mobile device assembly of FIG. 1 may provide advantageous effects. For example, by having the display module pressed between the front frame portion and the chassis, the display module may be kept securely in its place in the mobile device assembly. The mutual locations of the chassis and the front frame portion of the circumferential frame, as well as their structures, may be advantageously so selected and designed that the compressive forces applied to the display module are sufficient for keeping the display module in its place without any need to mount the display module to any surrounding mobile device assembly e.g. by means of an adhesive. Then, the display module may be separated from the mobile device assembly simply by separating the chassis and the frame from each other, and removing the display module via the back opening, after which it is ready for reuse. Alternatively, in the case of a broken display module, the removed display module can be replaced by a new one Further, by having the chassis and the circumferential frame attached together by means of an adhesive, no mechanical mounting means such as screws or snap joint structures are necessitated. In other words, an attachment by means of the adhesive only is possible. This may allow having a circumferential frame structure which is narrow in the lateral direction of the mobile device assembly. This may further allow having a narrow dead band, i.e. the edge portion of the mobile device assembly extending laterally outside the operable area of the display module. Thus, a large portion of the mobile device assembly may be covered by the operable area of the display module, i.e. the area thereof usable for displaying information to the user of a mobile device incorporating the mobile device assembly. Further, the attachment of the chassis to the circumferential frame by means of an adhesive may be straightforward to unmount by just removing the adhesive of breaking the adhesive joint.

Many details of a mobile device assembly may vary from those of the FIG. 1 example. For example, the chassis shape and the attachment of the chassis plate to the chassis support part may be implemented differently from the example of FIG. 1. As one example, the chassis plate may be without any curved edge section. It is also possible that the chassis plate, instead of the chassis support part, is in contact, directly or via an intermediate cushion layer, with the display assembly back surface, thereby supporting the display module.

Naturally, also the details of the circumferential frame may vary. For example, the cross-sectional dimensions and shapes thereof may be designed differently from FIG. 1 representing just a schematic drawing not in scale. It is also possible that the circumferential frame comprises no side frame portion at all. In such case, the chassis may be shaped and dimensioned so that it may be attached directly to the front frame section.

Figure 2:
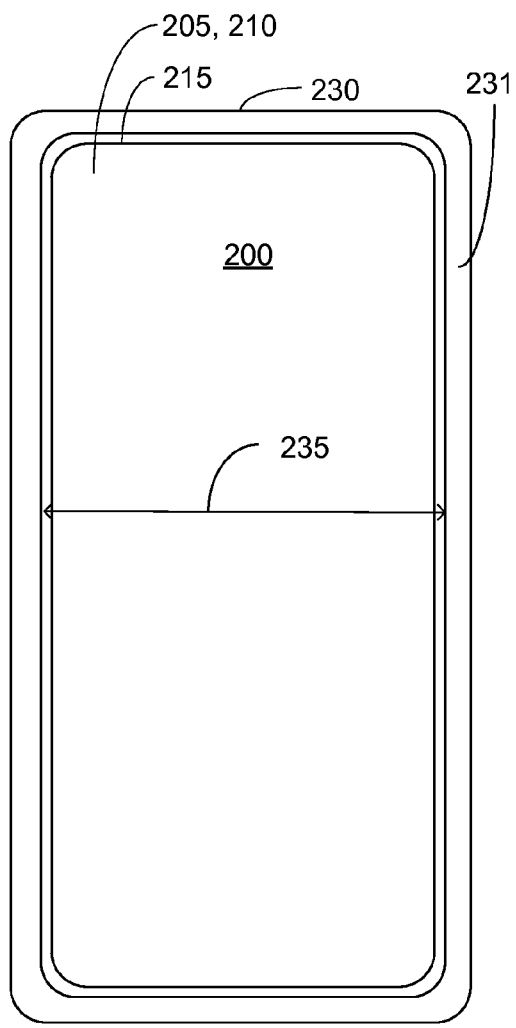
FIG. 2 shows a front view of a mobile device assembly.

FIG. 2 shows as a front view a mobile device assembly 200 which may be, for example, a mobile device assembly similar to the one illustrated in FIG. 1. The mobile device comprises a display module 205 with a window plate 215 as the outermost part thereof. The mobile device assembly comprises a circumferential frame 230 having a front frame portion 231 forming a closed circumferential structure. The front frame portion defines a front opening 235 which is slightly larger than the width of the window plate 215 so that the latter lies in the opening. Below the window plate, not separately visible in the drawing, there is a display assembly 210 which is slightly larger in the lateral direction than the front opening 235 so that the edges thereof extend behind the front frame portion.

The display module is pressed between the front frame portion and a chassis (not shown in the drawing) supporting the display module from backwards, and being attached, by means of an adhesive, to the circumferential frame.

FIG. 3 shows as a front view a mobile device assembly 300 which may be, for example, a mobile device assembly similar to the one illustrated in FIG. 1. The mobile device comprises a display module 305 with a window plate 315 as the outermost part thereof. The mobile device assembly comprises a circumferential frame 330 having a front frame portion comprising two discrete front frame sections 331a, 331b lying at opposite sides of the display. The front frame portion defines a front opening 335 which is slightly larger than the window plate 315 at the location of the front frame sections so that the latter lies in the opening. Below the window plate, not separately visible in the drawing, there is a display assembly 310 which, at the location of the front frame sections 331a, 331b, is slightly wider than the front opening 235 so that the edges thereof extend behind the front frame portion.

The display module is pressed between the front frame portion and a chassis (not shown in the drawing) supporting the display module from backwards, and being attached, by means of an adhesive, to the circumferential frame.

Outside the front frame sections, the display module 305 may simply lie on the circumferential frame, possibly mounted thereto. Alternatively, outside those front frame sections, the window plate may extend beyond the edge of the display assembly 310 and thus form the outermost edge, in the lateral direction, of the display module. In this latter example, in those areas outside the front frame sections, the window plate edge areas could lie on the circumferential frame, possibly mounted thereto.

In any of the examples above, the circumferential frame, at least the front frame portion thereof, may be designed and configured to serve as a part of an outer casing of a mobile device in which the mobile device assembly is or is intended to be incorporated. Thus, it is possible that no other outer casing is required to cover the circumferential frame.

Figure 4:
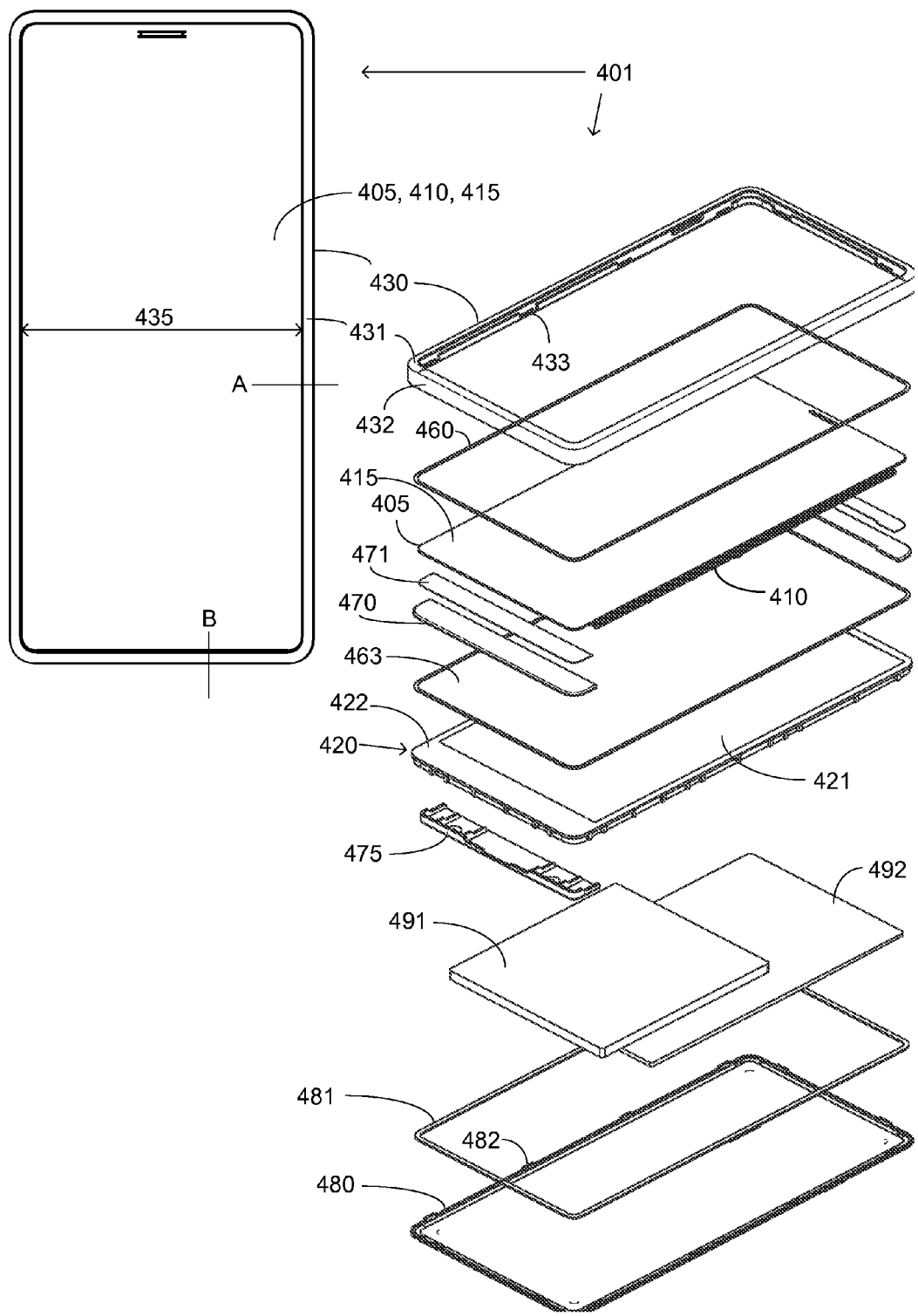
FIG. 4 shows a front view and an exploded view of a mobile device.

The mobile device 401 shown in the front view and the exploded view of FIG. 4 comprises a display module 405 having a window plate 415 as its outermost part in the thickness direction of the mobile device. The window plate has a window plate front surface 416, a window plate back surface 417, and a window plate edge 418, which are more clearly illustrated in FIG. 5 and FIG. 6.

Figure 5:
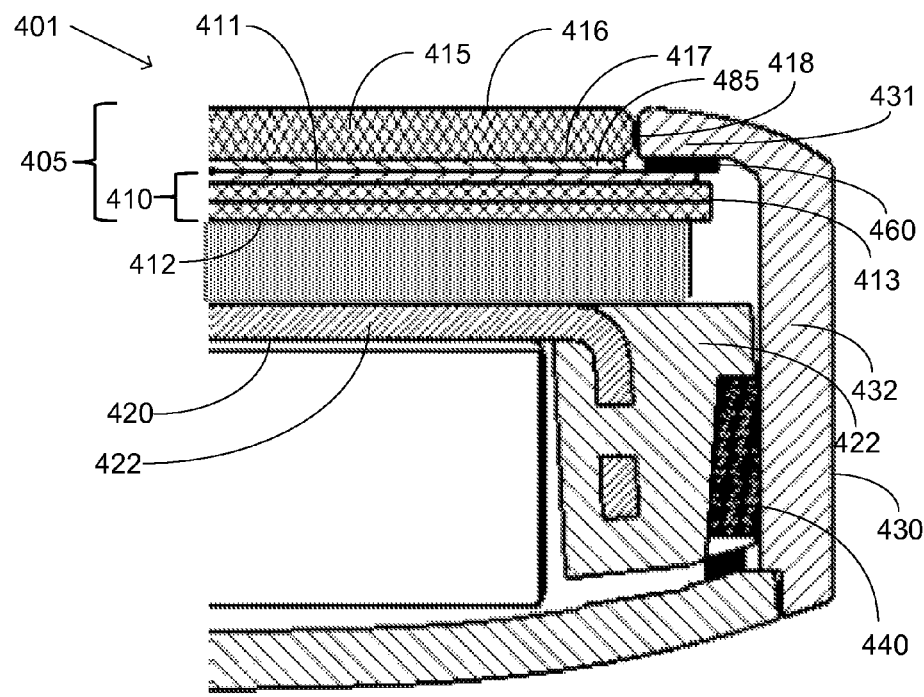
FIG. 5 shows a detail view of a mobile device assembly of FIG. 4.
Figure 6:
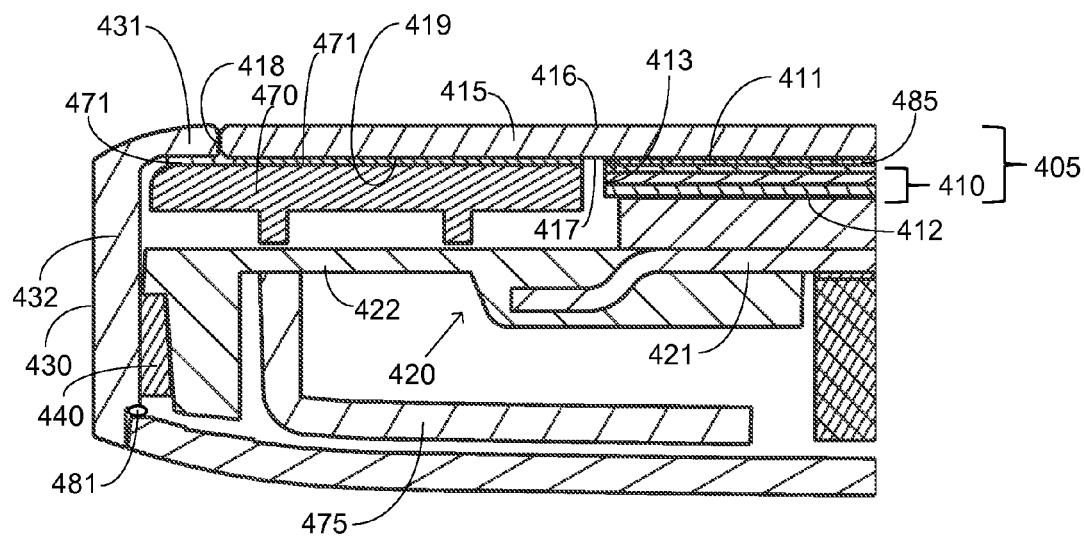
FIG. 6 shows a detail view of a mobile device assembly of FIG. 4.

The display module also comprises a display assembly 410 having a front surface 411, a back surface 412, and a peripheral edge surface 413, which are more clearly illustrated in FIG. 5 and FIG. 6. The display assembly may comprise a touch screen, i.e. a touch sensitive interactive display.

The window plate 415 is mounted from the window plate back surface to the front surface of the display assembly.

Below the display module, there is a chassis 420 supporting the display module 405 from the back side thereof, actually from the back surface of the display assembly. However, the chassis is not in direct contact with the display assembly but there is an intermediate cushion plate 463 between the chassis and the display assembly.

The chassis 420 comprises a chassis plate 421 and a chassis support part 422 integrally attached together.

Various mobile device elements, such as a battery 491 and a printed wiring board (PWB) 492, are located on the back side of the chassis plate 421. A plurality of components, such as a camera module (not shown in the drawing), may be mounted to or integrated in the printed wiring board.

The mobile device 401 comprises further a circumferential frame 430 comprising a front frame portion 431 and a side frame portion 432, those two portions forming an integral, inseparable frame structure. The side frame portion encloses the display assembly 410 and the chassis 420. The side frame portion defines a back opening 436, better visible in FIG. 5 and FIG. 6, larger than the chassis and the display module. The front frame portion 431 extends laterally from the front edge of the side frame portion towards the central area of the mobile device. The front frame portion forms a closed circumferential structure, and defines a front opening 435 which is, in each lateral direction, smaller than the display module width in that direction.

The window plate 415 is smaller than the front opening 435 so that it fits therein.

The chassis is attached, via the chassis support part 422, to the side frame portion 432 of the circumferential frame, by means on an adhesive (not shown in FIG. 4). The relative locations of the chassis and the circumferential frame in the thickness direction of the mobile device are so fixed by said attachment by means of the adhesive that opposite compressive forces are applied to the back and the front surfaces 412, 411 of the display assembly. The display module is thus pressed between the front frame portion 431 of the circumferential frame and the chassis. Thereby, the display assembly may be kept securely in its place in the mobile device.

A front gasket 460 in the form of a gasket ring, which may be formed of a resilient material, is located between the front frame portion 431 of the circumferential frame and the display module 405.

As will be discussed in more detail below, there are two window carriers 470 mounted to the window plate back surface 417 at opposite ends of the window plate by means of adhesive regions 471. At one end of the mobile device, an additional carrier frame 475 is located beneath the chassis 420.

As the outermost part on the back side of the mobile device, there is a back cover 480. The back cover is mounted by means of an adhesive ring 481 to the back side edge of the side frame portion 432 of the circumferential frame. The back cover also comprise snap protrusions 482 fitted to corresponding snap recesses 433 arranged in the side frame part 432 of the circumferential frame.

The outer casing of the mobile device 401 is thus mainly formed by the circumferential frame 430, the window plate 415, and the back cover 480.

FIG. 5 shows a partial cross section of the mobile device 401 at location A marked to the side edge of the mobile device in FIG. 4. FIG. 6 shows a partial cross section of the mobile device 401 at location B marked to the bottom edge of the mobile device in FIG. 4.

As shown in FIG. 5 and FIG. 6, the window plate 415 is mounted from its back surface 417 to the front surface 411 of the display assembly by means of an adhesive layer 485.

As shown in FIG. 5, at the cross-section A, the window plate 415 is narrower than the front opening 435 defined by the front frame portion 431 of the circumferential frame. The display assembly 410 extends, in this part of the mobile device, beyond the window plate edge 418, and thus defines the display module width at that location. The front frame portion presses the edge area of the display assembly towards the back side of the mobile device assembly.

At the location A, the chassis has a planar upper surface so that both the chassis plate and the chassis support part support the display module from the back surface 412 of the display assembly.

As shown in FIG. 6, at the cross-section B, the window plate 415 extends beyond the display assembly edge. So, the window plate back surface has a free edge area 419 which does not lie on the display assembly 410. The window carrier 470 is mounted to the window plate, to this free edge area of the window plate back surface 417, by means of the adhesive region 471. The window carrier extends beyond the window plate edge 418, and thus defines the display module width at this location. The front frame portion 431 presses the edge area of the window carrier towards the back side of the mobile device. The pressing force is conveyed via the window plate edge area to the front surface 411 of the display assembly. Because the chassis 420 supports the display module from the back side thereof, from the back surface 412 of the display assembly, the front frame portion and the chassis cause opposite compressive forces to be applied on the front surface and the back surface of the display assembly, respectively. Thereby, the display module is pressed between the chassis and the front frame portion.

In FIG. 5 and FIG. 6, an adhesive block 440 attaching the side frame portion 432 and the chassis support part 422 together, is shown. The adhesive block may form a continuous, closed ring structure over the entire circumference of the mobile device. Alternatively, there may be a plurality of discrete adhesive blocks located along said circumference.

Naturally, it is also possible to have a mobile device where there are no different areas where the pressing of the display module is arranged differently, as is the case in the example illustrated in FIG. 4, FIG. 5, and FIG. 6. It would thus be possible that the structure of the mobile device would be in accordance with one of FIG. 5 and FIG. 6 throughout the entire periphery of the mobile device.

In the following, some aspects common for those different mobile device assembly and mobile device examples described above are discussed.

The circumferential frame may be made of a metal, such as aluminum, stainless steel, or magnesium, or any alloy thereof. Alternatively, it may be made of a plastic, such as polycarbonate (PC), polyamide (PA), or acrylonitrile butadiene styrene (ABS), or a combination thereof, e.g. PC/ABS. By using a plastic, a light-weight frame may be made with accurate shapes and dimensions. A plastic circumferential frame may also be a low cost, disposable element which can be broken if the display assembly is to be removed from the mobile device or mobile device assembly.

The chassis plate may be formed of a plastic or a metal, for example. The chassis support part may be formed, for example, of a plastic. Suitable metals for the chassis plate include, for example, aluminum, stainless steel, and magnesium. Suitable plastics for the chassis support part include, for example, polycarbonate (PC) and polyamide (PA). In the case of a metal chassis plate and a plastic chassis support part, the integral attachment of those two parts may be achieved e.g. by molding the chassis support part so that the chassis plate edge area remains within the molded chassis support part.

By "adhesive" is meant in this specification any material capable of providing sufficient adhesive forces for attaching two bodies together. Examples of adhesives are various types of glues. For example, the adhesive attaching the chassis and the circumferential frame may be of any type of glue which is suitable for joining together the materials of the chassis and the circumferential frame. Such glue may be of a dispenser-applicable type. An adhesive may be applied as a flowable, curable glue which is then cured automatically or e.g. by means of heat. An adhesive may also be initially inactive, i.e. without any adhesive property or having only limited adhesive property, and activable by means of an activating agent or e.g. heat. An adhesive may also be applied between two bodies in the form of an adhesive film or an adhesive tape. For example, in the case of the adhesive attaching the chassis and the circumferential frame together, the adhesive may be heat releasable adhesive. This may facilitate the separation of the chassis and the circumferential frame.

The thickness of the front frame portion and, in the case of a front gasket present between the display module and the front frame portion of the circumferential frame, also the thickness of the gasket may be adapted so that the overall thickness of the front gasket and the possible gasket, the latter being in its compressed state in the completed assembly, is higher than the thickness of the window plate. This may help protection of the window plate, the front surface thereof remaining behind the plane defined by the front frame portion.

The mobile device assembly and the mobile device, as well as various parts thereof in the above examples are illustrated and named in a way which might indicate a planar shape and nature of those assembly, device, and parts. However, any of a mobile device assembly, a mobile device, and parts thereof may also deviate from purely planar nature and be formed, for example, as a curved body.

Figure 7:
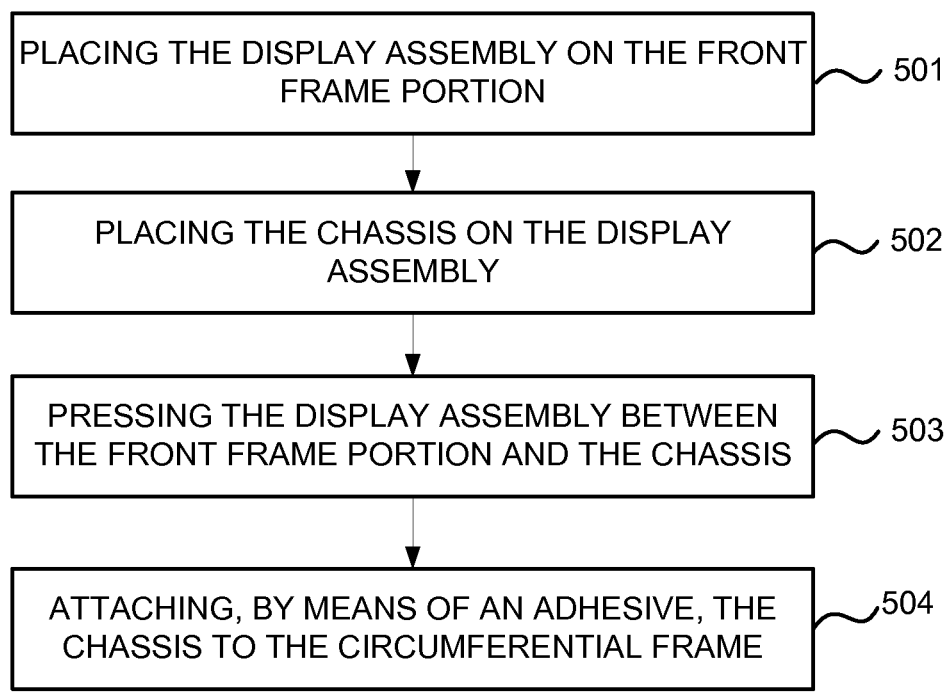
FIG. 7 shows a manufacturing method.

The method of FIG. 7 may be used for manufacturing or assembling a mobile device assembly which comprises: a display module comprising a display assembly, the display assembly having a front surface and a back surface; a chassis supporting the display module from the back surface of the display assembly; and a circumferential frame having a front frame portion defining a front opening smaller than a display module width.

The mobile device assembly may be similar to, but is not limited to, those mobile device assembly examples described above, or an assembly forming a part of the above mobile device example. On the other hand, what is described above about the definitions, the details, the ways of implementation, and the advantageous effects of the mobile device assemblies and the mobile devices apply, mutatis mutandis, to the method aspect discussed below. The same apply vice versa.

The method comprises placing the display module on the front frame portion of the circumferential frame in step 501; placing the chassis on the display module in step 502, thereby pressing the display module between the front frame portion and the chassis in step 503; and attaching, by means of an adhesive, the chassis to the circumferential frame in step 504 so that the display module remains pressed between the chassis and the front frame portion of the circumferential frame.

Said phases of the method may be performed sequentially. On the other hand, it is not necessary to first place the display module on the front frame portion, followed by placing the chassis on the display module, and only thereafter press the display module between the front frame portion and the chassis. Instead, two or more of those phases may be performed simultaneously. For example, the chassis and the display module may be brought together on the front frame portion.

As discussed in the context of the mobile device assembly and the mobile device aspects above, there may be also various additional layers, such as cushions, gaskets, and adhesive layers, between those three elements superposed in the method of FIG. 7.

Using the method of FIG. 7, a mobile device assembly may be assembled from the back side thereof. In other words, the different parts of the assembly may be inserted into the assembly from the back side thereof via the back opening, and brought on the front frame portion of the circumferential frame forming the foremost part of the assembly.

The adhesive for attaching the chassis to the circumferential frame, thereby fixing the relative locations of the chassis and the circumferential frame in the thickness direction of the mobile device assembly may be a curable adhesive which is applied between the chassis and the circumferential frame in flowable form or state.

Some aspects of certain embodiments are shortly discussed in the following.

A mobile device assembly comprises: a display module comprising a display assembly, the display assembly having a front surface, a back surface, and a peripheral edge surface; a chassis supporting the display module from the back surface of the display assembly; and a circumferential frame having a front frame portion defining a front opening smaller than a display module width; the display module being pressed between the front frame portion and the chassis, the chassis being attached, by means of an adhesive, to the circumferential frame.

On the other hand, a mobile device may comprise: a display module comprising a display assembly, the display assembly having a front surface and a back surface; a chassis supporting the display module from the back surface of the display assembly; and a circumferential frame having a front frame portion defining a front opening smaller than a display module width; the front frame portion and the chassis being attached together, by means of an adhesive, so located relative to each other that the front frame portion and the chassis cause opposite compressive forces to be applied on the front surface and the back surface of the display assembly, respectively. The display assembly may further have a peripheral edge surface.

In an embodiment, the circumferential frame further has a side frame portion, at least partially enclosing the possible peripheral edge surface of the display assembly, the chassis being attached, by means of the adhesive, to the side frame portion of the circumferential frame.

In an embodiment with a side frame portion, the side frame portion defines a back opening larger than the display module width.

In an embodiment which may be combined with any of the above embodiments, the chassis comprises a chassis plate and a chassis support part integrally attached together, the chassis being attached, by means of the adhesive, to the circumferential frame via the chassis support part. The chassis plate may be made of a metal, and the chassis support part is made of a plastic.

In an embodiment which may be combined with any of the above embodiments, the assembly comprises a front gasket between the display module and the front frame portion of the circumferential frame.

In an embodiment which may be combined with any of the above embodiments, the assembly comprises a back cushion of a resilient material between the back surface of the display assembly and the chassis.

In an embodiment which may be combined with any of the above embodiments, the circumferential frame is made of a plastic.

In an embodiment which may be combined with any of the above embodiments, the adhesive comprises a heat releasable adhesive.

In an embodiment which may be combined with any of the above embodiments, the front frame portion comprises discrete front frame sections at opposite sides of the circumferential frame, the front opening being defined by the discrete front frame sections. In an alternative embodiment, the front frame portion forms a closed circumferential structure.

In an embodiment which may be combined with any of the above embodiments, the display module comprises a window plate having a window plate back surface, a window plate front surface, and a window plate edge, the window plate being mounted on the front surface of the display assembly with the window plate back surface facing the display assembly, the window element having a window width smaller than the front opening.

In an embodiment where the display module comprises a window plate, there is a front gasket between the display module and the front frame portion of the circumferential frame, wherein the window plate, the front gasket, and the front frame portion have thicknesses which cause the overall thickness of the front frame portion and the front gasket being higher than the thickness of the window plate.

In an embodiment where the display module comprises a window plate, and the mobile device assembly possibly comprises also a front gasket, the display assembly extends beyond the window plate edge, the display assembly thereby defining the display module width. In an alternative embodiment where the display module comprises a window plate, and the mobile device assembly possibly comprises also a front gasket, the window plate extends beyond the edge of the display assembly, the window plate back surface thereby having a free edge area, and wherein the display module further comprises a window carrier mounted on the free edge area, the window carrier extending beyond the window plate edge, thereby defining the display module width. In an embodiment, the window carrier is made of a plastic.

In another aspect, a mobile device comprises: a display module comprising a display assembly, the display assembly having a front surface and a back surface; a chassis supporting the display module from the back surface of the display assembly; and a circumferential frame having a front frame portion defining a front opening smaller than a display module width; the front frame portion and the chassis being attached together, by means of an adhesive, so located relative to each other that the front frame portion and the chassis cause opposite compressive forces to be applied on the front surface and the back surface of the display assembly, respectively.

On the other hand, a mobile device may comprise a mobile device assembly as any of those examples discussed above.

In an embodiment of a mobile device as either of those two examples above, the circumferential frame forms a part of an outer casing of the mobile device.

In yet another aspect, a method is suitable for manufacturing a mobile device assembly comprising: a display module comprising a display assembly, the display assembly having a front surface and a back surface; a chassis supporting the display module from the back surface of the display assembly; and a circumferential frame having a front frame portion defining a front opening smaller than a display module width. The method comprises: placing the display module on the front frame portion of the circumferential frame with the front surface of the display assembly facing the front frame portion; placing the chassis on the back surface of the display module, thereby pressing the display module between the front frame portion and the chassis; and attaching, by means of an adhesive, the chassis to the circumferential frame so that the display module remains pressed between the chassis and the front frame portion of the circumferential frame.

In an embodiment, said attaching the chassis to the circumferential frame comprises applying a curable adhesive, in flowable state, between the chassis and the circumferential frame. Said curable adhesive may be then cured, e.g. by means of heat, to complete the attachment.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term 'comprising' is used herein to mean including the method blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification. In particular, the individual features, elements, or parts described in the context of one example, may be connected in any combination to any other example also.

The invention claimed is:

1. A mobile device assembly comprising: a display module comprising a display assembly, the display assembly having a front surface, a back surface, and a peripheral edge surface; a chassis supporting the display module from the back surface of the display assembly; a circumferential frame having a front frame portion defining a front opening smaller than a display module width, the display module being pressed between the front frame portion and the chassis, the chassis being attached, by means of an adhesive, to an interior side of the circumferential frame, a portion of the interior side of the circumferential frame being perpendicular to the display module; and a back cover on an outermost back side of the mobile device assembly, the back cover comprising an end, a surface of the end of the back cover being parallel with the portion of the interior side of the circumferential frame and directly abutting the portion of the interior side of the circumferential frame.

2. A mobile device assembly as defined in claim 1, wherein the circumferential frame further has a side frame portion, at least partially enclosing the peripheral edge surface of the display assembly, the chassis being attached, by means of the adhesive, to the side frame portion of the circumferential frame, and the back cover being attached to the side frame portion.

3. A mobile device assembly as defined in claim 2, wherein the side frame portion defines a back opening larger than the display module width.

4. A mobile device assembly as defined in claim 1, wherein the chassis comprises a chassis plate and a chassis support part integrally attached together, the chassis being attached, by means of the adhesive, to the circumferential frame via the chassis support part.

5. A mobile device assembly as defined in claim 4, wherein the chassis plate is made of a metal, and the chassis support part is made of a plastic.

6. A mobile device assembly as defined in claim 1, wherein the assembly comprises a front gasket between the display module and the front frame portion of the circumferential frame.

7. A mobile device assembly as defined in claim 1, wherein the assembly comprises a back cushion of a resilient material between the back surface of the display assembly and the chassis.

8. A mobile device assembly as defined in claim 1, wherein the circumferential frame is made of a plastic.

9. A mobile device assembly as defined in claim 1, wherein the adhesive comprises a heat releasable adhesive.

10. A mobile device assembly as defined in claim 1, wherein the front frame portion comprises discrete front frame sections at opposite sides of the circumferential frame, the front opening being defined by the discrete front frame sections.

11. A mobile device assembly as defined in claim 1, wherein the front frame portion forms a closed circumferential structure.

12. A mobile device assembly as defined in claim 1, wherein the display module comprises a window plate having a window plate back surface, a window plate front surface, and a window plate edge, the window plate being mounted on the front surface of the display assembly with the window plate back surface facing the display assembly, the window plate having a window width smaller than the front opening.

13. A mobile device assembly as defined in claim 12, further comprising a front gasket between the display module and the front frame portion of the circumferential frame, wherein the window plate, the front gasket, and the front frame portion have thicknesses which cause the overall thickness of the front frame portion and the front gasket being higher than the thickness of the window plate.

14. A mobile device assembly as defined in claim 12, wherein the display assembly extends beyond the window plate edge, the display assembly thereby defining the display module width.

15. A mobile device assembly as defined in claim 12, wherein the window plate extends beyond the edge of the display assembly, the window plate back surface thereby having a free edge area, and wherein the display module further comprises a window carrier mounted on the free edge area, the window carrier extending beyond the window plate edge, thereby defining the display module width.

16. A mobile device assembly as defined in claim 15, wherein the window carrier is made of a plastic.

17. A mobile device comprising: a display module comprising a display assembly, the display assembly having a front surface and a back surface; a chassis supporting the display module from the back surface of the display assembly; and a circumferential frame having a front frame portion defining a front opening smaller than a display module width, an interior side of the circumferential frame and the chassis being attached together, by means of an adhesive, so located relative to each other that the front frame portion and the chassis cause opposite compressive forces to be applied on the front surface and the back surface of the display assembly, respectively, a portion of the interior side of the circumferential frame being perpendicular to the display module; and a back cover on an outermost back side of the mobile device, the back cover comprising an end, a surface of the end of the back cover being parallel with the portion of the interior side of the circumferential frame and directly abutting the portion of the interior side of the circumferential frame.

18. A mobile device as defined in claim 17, wherein the circumferential frame forms a part of an outer casing of the mobile device.

19. A method for manufacturing a mobile device assembly comprising a display module comprising a display assembly, the display assembly having a front surface and a back surface; a chassis supporting the display module from the back surface of the display assembly; a circumferential frame having a front frame portion defining a front opening smaller than a display module width; and a back cover on an outermost back side of the mobile device assembly, the back cover comprising an end; the method comprising: placing the display module on the front frame portion of the circumferential frame with the front surface of the display assembly facing the front frame portion; placing the chassis on the back surface of the display module, thereby pressing the display module between the front frame portion and the chassis; attaching, by means of an adhesive, the chassis to an interior side of the circumferential frame so that the display module remains pressed between the chassis and the front frame portion of the circumferential frame; and attaching a surface of the end of the back cover directly to the interior side of the circumferential frame such that the surface of the end of the back cover is directly abutting a portion of the interior side of the circumferential frame, and the surface of the end of the back cover and the portion of the interior side of the circumferential frame being perpendicular to the display module.

20. A method as defined in claim 19, wherein attaching the chassis to the circumferential frame comprises applying a curable adhesive, in flowable state, between the chassis and the circumferential frame.

* * * * *